United States Patent [19]
Latanzi

[11] 3,986,244
[45] Oct. 19, 1976

[54] OPTICAL GUIDANCE METHODS AND APPARATUS FOR TREATMENT OR ASSEMBLY OF PRINTED CIRCUIT BOARDS AND SIMILAR WORKPIECES

[75] Inventor: Lewis A. Latanzi, Bethel, Conn.

[73] Assignee: Contact Systems, Inc., Danbury, Conn.

[22] Filed: Nov. 19, 1975

[21] Appl. No.: 633,180

[52] U.S. Cl. .............................. 29/407; 29/203 B; 29/626; 312/234; 340/381; 350/30
[51] Int. Cl.² .................. B23Q 17/02; B23Q 17/18
[58] Field of Search.......... 29/625, 626, 628, 203 J, 29/203 B, 203 MW, 407, 203 P; 312/234, 234.1; 356/164, 165, 166, 168; 340/282, 380, 381; 350/30

[56] References Cited
UNITED STATES PATENTS

| | | | |
|---|---|---|---|
| 2,959,848 | 11/1960 | Savitt | 29/407 |
| 3,112,354 | 11/1963 | Urias et al. | 356/168 |
| 3,621,554 | 11/1971 | Feldman et al. | 29/626 X |
| 3,710,477 | 1/1973 | Frawley | 29/203 B |
| 3,852,865 | 12/1974 | Ragard | 29/203 B |

Primary Examiner—Victor A. DiPalma
Attorney, Agent, or Firm—Mattern, Ware, Davis and Stoltz

[57] ABSTRACT

Visual guidance methods and apparatus are provided for directing the treatment of workpieces, such as the assembly of printed circuit boards, by providing a full-size optical image of each successive treatment step in turn, superimposed on the operator's actual view of the workpiece itself. The workpiece is viewed through a half-silvered mirror which also delivers an image of a programmed mylar film with instructional steps and parts shown as full-size partial images superimposed on the operator's view of the workpiece itself. Simultaneous actuation of parts storage bin trays automatically delivers the required parts for each assembly step. Indexing of the apparatus moves the mylar film to exhibit the next treatment step, aligned with the workpiece, by index code indicia accompanying each partial image to be superimposed on the view of the workpiece, and simultaneously exposes the next parts storage bin for delivery of the next required component part to the operator.

14 Claims, 12 Drawing Figures

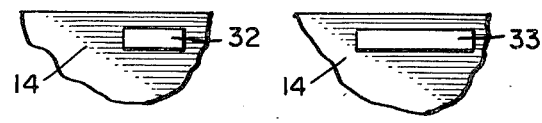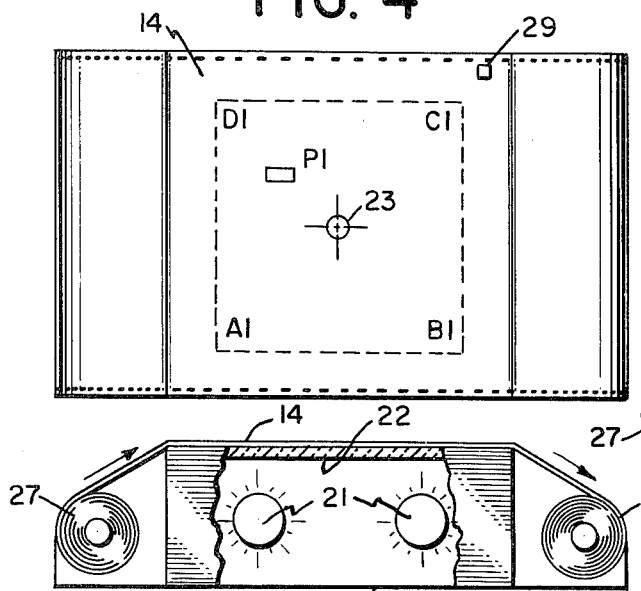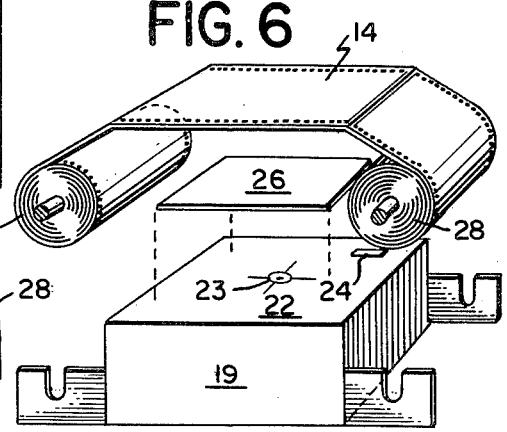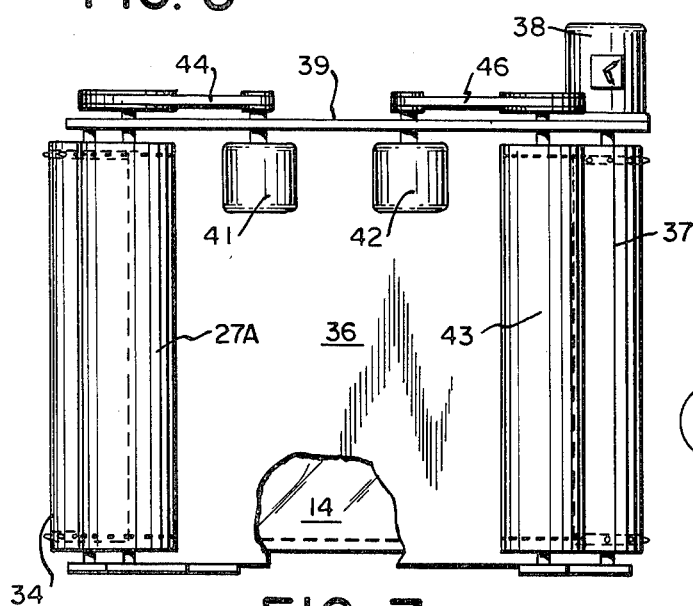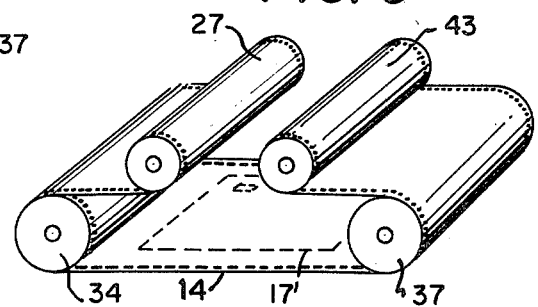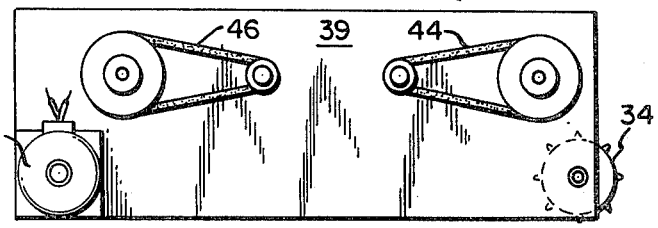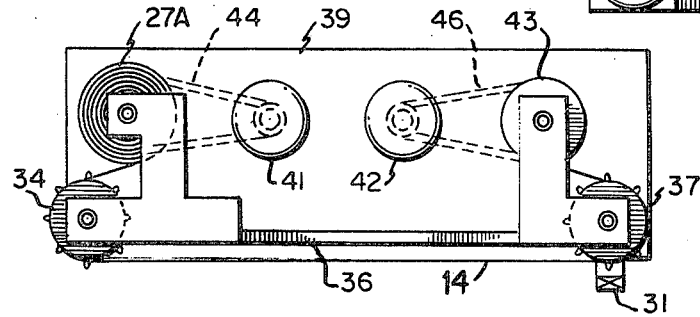

OPTICAL GUIDANCE METHODS AND APPARATUS FOR TREATMENT OR ASSEMBLY OF PRINTED CIRCUIT BOARDS AND SIMILAR WORKPIECES

This invention relates to methods and apparatus for the guidance of assembly and treatment operations such as the assembly of component parts on printed circuit boards, and particularly to apparatus and methods employing visual aids showing the operator the component part and the location of its installation and attachment in each successive treatment step.

BACKGROUND OF THE INVENTION

The increasing requirements of the electronics industry for printed circuit boards with component parts assembled and mounted thereon has produced an increasing need for visual aid equipment which can be programmed to provide guidance for the assembly operator over a long series of successive assembly steps, during which many different types of component parts are selected sequentially and assembled in predetermined positions on the printed circuit board.

To avoid the time and expense required to prepare written instruction programs, and the unavoidable operator errors and fatigue involved in reading and following such written programs, visual guidance systems have been proposed and several different visual systems have been marketed. RCA Industrial and Automation Systems of Plymouth, Michigan and Video Wire Inc. of Levittown, Pennsylvania have sold a "Parts Caddy Optical Programming System", utilizing bundles of optical fibers whose ends are epoxy-sealed in the holes of an actual printed circuit board, and are successively illuminated by a programmed optical system.

Other manufacturers, such as Contact Systems, Inc. of Danbury, Connecticut in its "SC200 Component Locator", Modern Plant Equipment Company of Southport, Connecticut in its "NP-48 Assembly Station", and Ragen Precision Instruments, Inc. of North Arlington, New Jersey utilize a slide projector placing an arrow on a screen viewed by the operator, immediately above the printed circuit assembly location. Carlton Design, Inc. of Big Flats, New York has marketed Carlton Component Insertion Equipment, backlighting a printed circuit board with selected spots of illumination. The Manix Manufacturing Division of Henry Mann, Inc. of Huntingdon, Pennsylvania sells a "Manix L35 Assembly System" employing a film strip. Several of these programmed visual aids are coordinated with the sequential exposure of selected bins of component parts.

In its U.S. Pat. No. 3,112,354, the Hughes Aircraft Company has disclosed and claimed a printed circuit assembly visual aid system in which the operator views a printed circuit board through a half-silvered mirror in which the operator simultaneously sees an image of an overhead projection screen. A slide projector and changer are employed to project, through a second, overhead mirror, the images of previously prepared photographic slides illustrating the workpiece in each successive step of the assembly operation.

All of these conventional prior art visual aid systems require either the considerable expense of optical fiber bundle arrangements cemented in place to a specimen printed circuit board, or a series of masks or photographic slides whose registration and alignment must necessarily be extremely critical if helpful guidance is to be provided to the operator. These devices easily fall out of alignment, and slide projectors are notoriously poor at registration of successive views, while exhibiting much unnecessary and distracting detail in each view.

For these reasons a simpler and more foolproof visual aid device has long been needed for the visual guidance of assembly operators performing long series of successive assembly or treatment steps on miniature workpieces such as printed circuit boards.

SUMMARY OF THE INVENTION

The present invention minimizes the cost of the visual guidance equipment required for exhibiting successive operational treatment steps to the operator, by employing a series of one-to-one full scale "partial" images of the workpiece, each representing one operational treatment step, and omitting all superfluous details. These images appear on a sheet of translucent mylar program film positioned above a partially reflective or half-silvered mirror. The overhead mylar film partial image is preferably slanted downward and rearwardly away from the operator, toward a line on the plane of the half-silvered mirror coinciding with its intersection with the plane of the printed circuit workpiece, suspended below the half-silvered mirror on an upwardly and rearwardly slanted workholder.

In this manner, the operator looking downward through the half-silvered mirror views the workholder-supported printed circuit board in a convenient work station position. At the same time, the operator views an image in the half-silvered mirror of the partial workpiece image on the mylar film. By adjustment, the actual workpiece and the partial image are superimposed and appear to coincide, providing the operator with an instant indication of each part and the position where it should be installed on the workpiece during each successive treatment step. The workholder or the half-silvered mirror may be adjusted to assure coincidence of the partial image with the workpiece, and the one-to-one full-scale size of the partial image minimizes registration difficulties and alignment problems.

An automatic film advance system preferably provides longitudinal movement for an elongated web of the mylar film material, bringing successive partial images of the workpiece into substantially exact registration above the half-silvered mirror. At each indexed position, a different partial image is presented to the operator, showing each successive treatment step in sequence.

The indexing and registration of the elongated web of film material are governed by index code indicia carried by the web for juxtaposition with a code indicia sensor provided in the web-supporting drive system. When web advance is initiated by the operator, the web is moved forward until the next code indicium arrives in juxtaposition with the index code indicia sensor, which automatically produces a signal terminating the indexing movement. The web drive braking time is determined in advance and the resulting stop position of the web brings it into virtually perfect registration with the workpiece, which has been adjusted for visual superposition with the first partial image in the series.

The web is programmed on a separate programmer unit, comprising a light box having a frosted glass surface on which art work representing the workpiece is first secured. The translucent web is moved longitudinally from one indexed position to the next across the underlit frosted glass surface, and the successive treatment steps to be employed in treating the workpiece are successively marked on the exposed upper surface of the translucent web, using dry transfer rub-ons, grease pencils, ink, "stick-on" adhesive transfer indicia or the like.

Different index code indicia are employed to designate the end of the series of partial images, terminating the forward advance of the web and initiating its rewinding high speed reverse movement. Still a different index code indicium is employed to terminate reverse rewinding movement at the beginning of the web, to assure that it will not rewind off its supporting rollers.

Simultaneous control of component part delivery trays offering a multiplicity of parts in sequence to the operator is achieved by the program incorporated in the longitudinally moveable transverse web, and by this means each successive indexed partial image sequentially displayed to the operator automatically exposes a new component part storage tray to the operator, providing a ready supply of the parts to be assembled and mounted on the workpiece during each successive treatment step.

Accordingly a principal object of the present invention is to provide visual guidance methods and apparatus employing full-scale partial workpiece images which are easily programmed for operator guidance, and conveniently aligned to assure registration of the visual guidance image with the workpiece for superimposed viewing by the operator.

Another object of the invention is to provide such visual guidance methods and apparatus incorporating simple and convenient adjustment for registration alignment of each visual guidance image and the workpiece.

A further object of the invention is to provide such visual guidance methods and apparatus displaying a one-to-one full-scale partial image of the workpiece corresponding to each treatment operation, assuring visual alignment and registration with minimum adjustment.

Still another object of the invention is to provide visual guidance methods and apparatus incorporating an elongated translucent plastic programming film capable of convenient and economical programming with treatment indicia on a convenient programming device.

Still another object of the invention is to provide visual guidance methods and apparatus synchronously coordinated with a component parts storage bin assembly and automatically indexed to exhibit a preferred component parts storage tray to the operator sequentially with each new partial image of the workpiece displayed for the operator's view.

Other and more specific objects will be apparent from the features, elements, combinations and operating procedures disclosed in the following detailed description and shown in the drawings.

The invention accordingly comprises the several steps and the relation of one or more of such steps with respect to each of the others, and the apparatus embodying features of construction, combinations of elements and arrangements of parts which are adapted to effect such steps, all as exemplified in the following detailed disclosure, and the scope of the invention will be indicated in the claims.

For a fuller understanding of the nature and objects of the invention, reference should be had to the following detailed description taken in connection with the accompanying drawings, in which:

FIG. 1 is a perspective view of the preferred apparatus employed with the methods of the present invention incorporating a component locator visual guidance device connected to a multi-level rotary bin component storage and presentation assembly for simultaneous optical guidance of the operator during each treatment step and presentation to the operator of the component part to be installed during the performance of each step.

FIG. 4 is a top plan view of a light box programmer used to program the elongated translucent plastic programming films employed in the present invention.

FIGS. 4A and 4B are corresponding fragmentary comparison views of initial and final frames of the programmed film web of FIG. 4.

FIG. 5 is a cut-away front elevation view of the programmer of FIG. 4.

FIG. 6 is an exploded schematic perspective view of the programmer of FIGS. 4 and 5, illustrating the positioning of the workpiece art work and the elongated programming film web overlying the translucent illuminated surface of the programmer.

FIG. 7 is a top plan view of the web advance drive system employed in the component locator devices of the present invention.

FIG. 8 is a front elevation view of the web drive system of FIG. 7.

FIG. 9 is a fragmentary schematic perspective view of the web drive system of FIGS. 7 and 8, showing the plastic programming film after programming in FIG. 6 as it is installed in the component locator device drive system of FIG. 7; and FIG. 10 is a rear elevation view of the web drive system shown in FIGS. 7 and 8.

DETAILED DESCRIPTION

Figure 1:
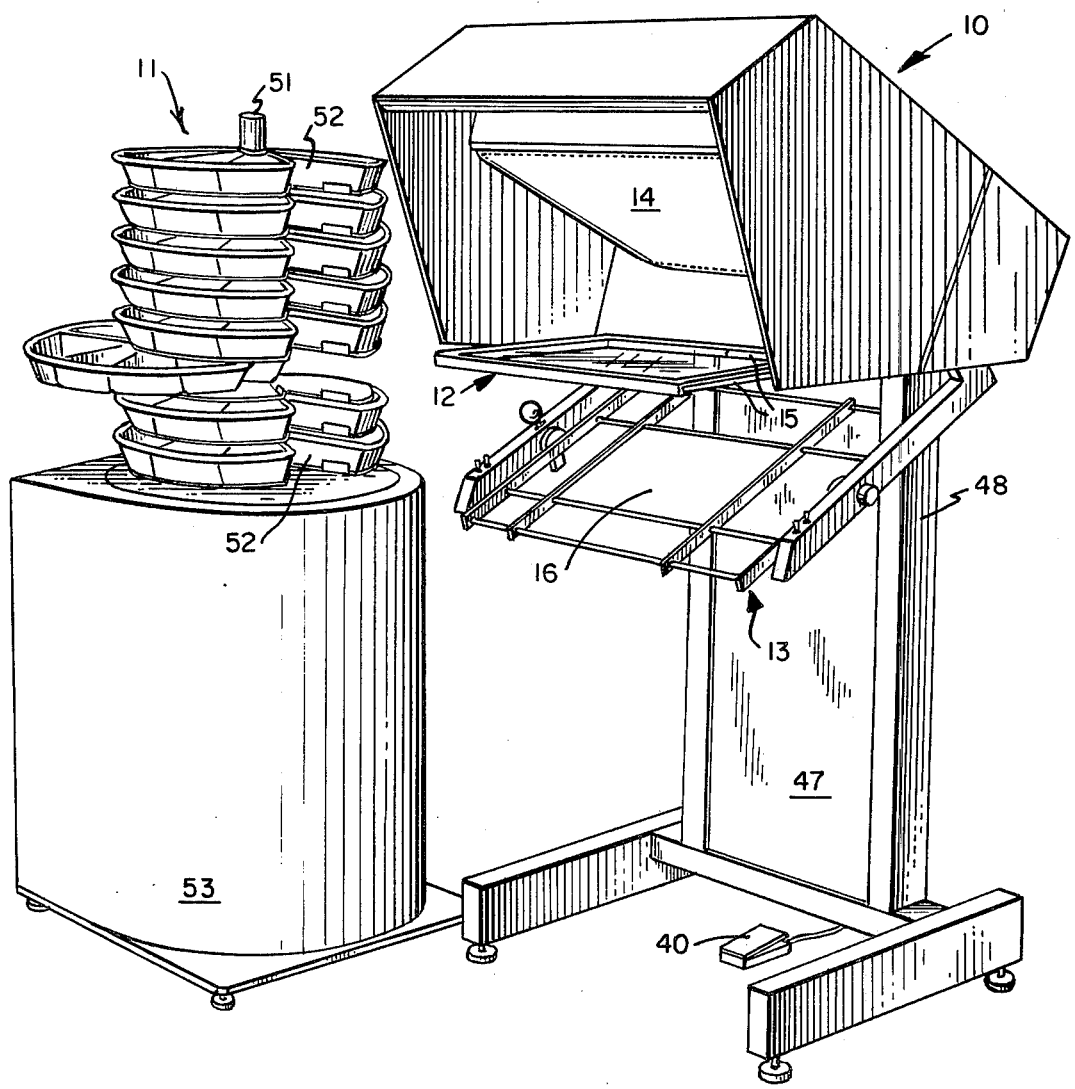

In the visual guidance methods and apparatus characterizing the present invention, a component locator device 10 shown in FIG. 1 is employed, preferably in combination with a multi-level rotary bin component storage and presentation assembly 11, also shown in FIG. 1. The locator device 10 incorporates a partially reflecting and partially transmissive "half-silvered" mirror 12, with an adjustable work holder 13 positioned beneath the mirror 12 for convenient viewing through the mirror by the operator, illuminated by a tubular glow discharge lamp 15 encircling the underside of the mirror's periphery.

Figure 3:
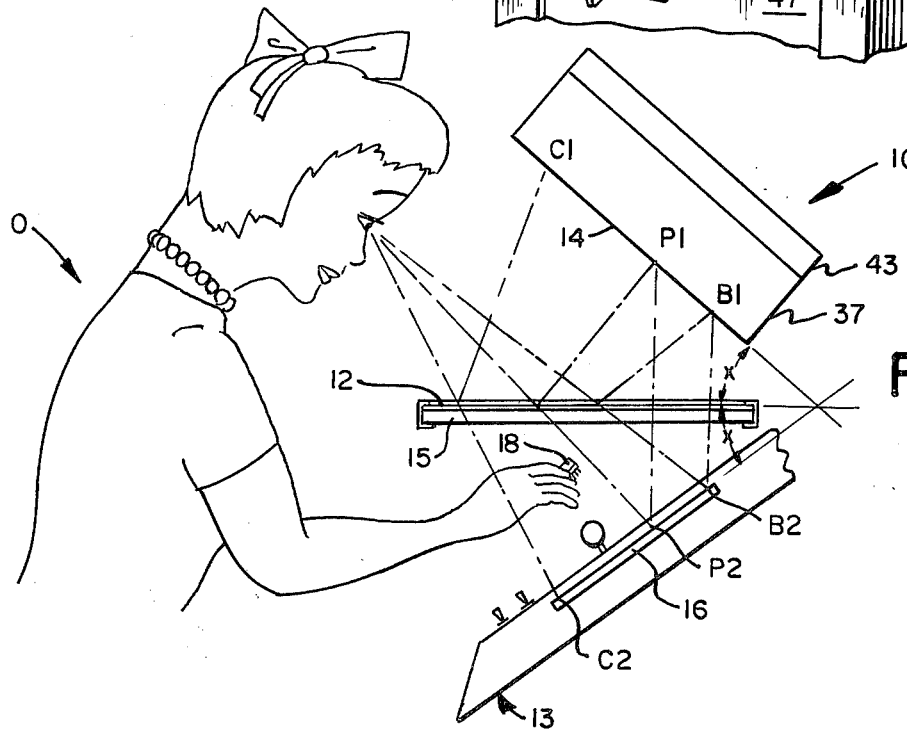
FIG. 3 is a side elevation schematic diagram of the optical image superposition employed in the methods and apparatus of the present invention.

A flexible translucent plastic programming film 14 is positioned above the mirror 12 and illuminated by lamp 15, where its image may be viewed in the half-silvered mirror 12 by the operator, as shown in FIG. 3. A workpiece 16, which may be a perforated printed circuit panel board for example, is adjustably mounted on the work holder 13 for operator viewing through the mirror 12. Successive one-to-one full-scale partial images of the workpiece 16, such as the partial image 17 are positioned or "programmed" on the film web 14.

Longitudinal indexing movement of web 14 provides sequential indexed display to the operator of a series of these successive partial images, representing successive treatment steps to be performed on the workpiece 16.

FULL-SIZE PARTIAL IMAGES

Figure 2:
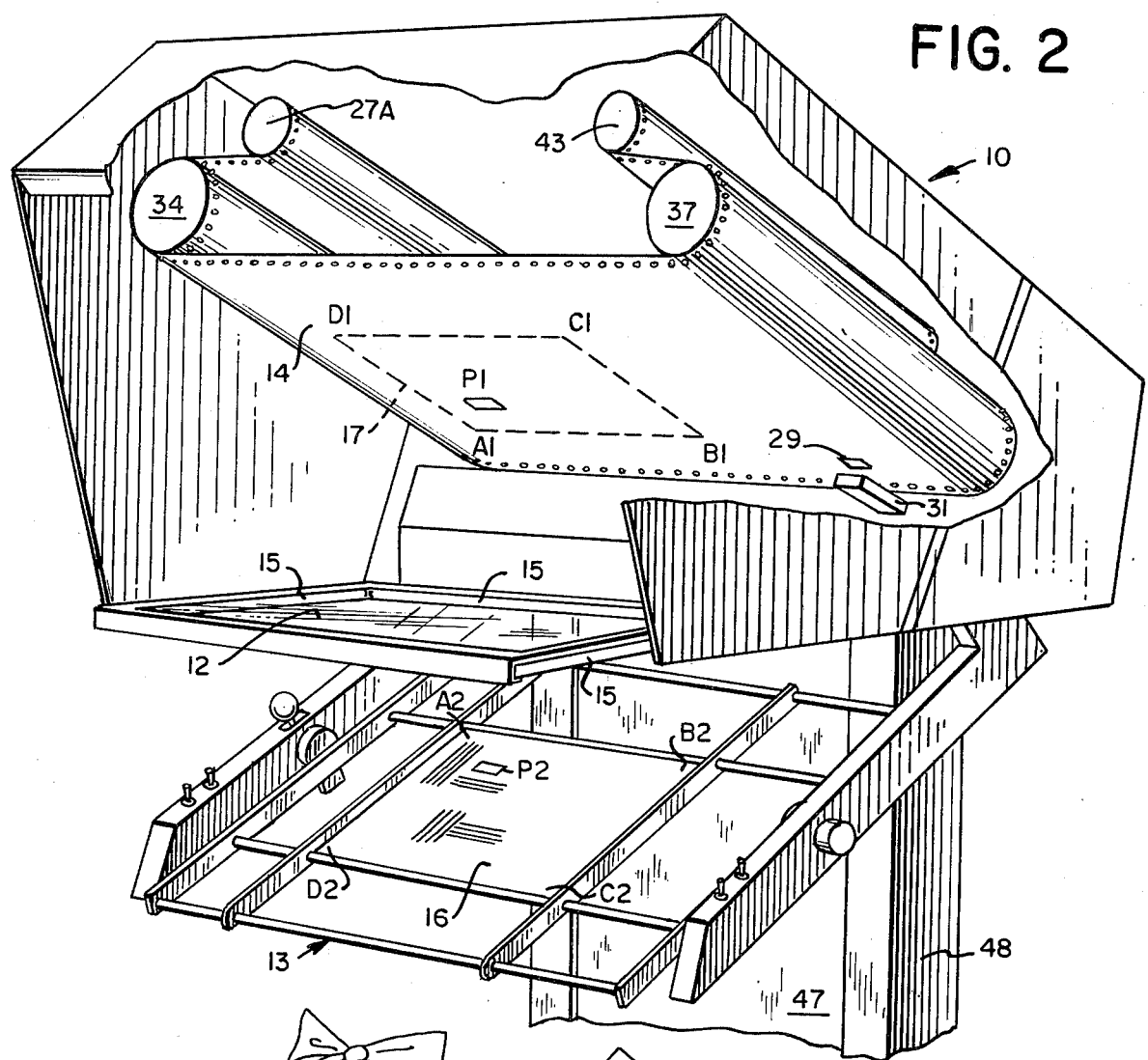
FIG. 2 is a fragmentary enlarged cut-away view of the optical system and work station in the component locator device.

The image 17 shown in FIGS. 2, 4 and 9 comprises one of these successive "partial" workpiece images. It may comprise the full-size dashed outline A1, B1, C1, D1 shown in FIG. 2 and FIG. 4, or if desired, these corner points of the outline of the workpiece image 17 may merely be indicated by point or corner indicia marked on the film 14 at these four points, without showing the connecting outlines. Alternatively, if registration of the image is assured, the point P1 showing a component part in full-scale size at the exact position where it is to be installed on the workpiece printed circuit board may be the only portion of image 17 shown in this frame of the web 14. When this frame is indexed into viewing position as shown in FIG. 2, the operator will view image P1 of film 14 in half-silvered mirror 12 and the image of this part will appear to be positioned at point P2 superimposed on the workpiece 16 beneath mirror 12, as shown in FIG. 3. The operator then need only select a part 18 and install it in the workpiece 16 at the image point P2 in order to complete the treatment step represented by the frame 17 displayed by the device.

When this treatment step is completed, the operator may then depress a foot pedal switch or pushbutton to initiate the indexing movement of web 14 in a longitudinal direction, until the next frame is brought into viewing position where a different component part indicium is displayed for installation in the next successive treatment step. As shown in FIGS. 2 and 3, the four corners of image 17, corners A1, B1, C1 and D1, are positioned so that their reflections in half-silvered mirror 12 appear at points A2, B2, C2 and D2, which are brought into coinciding superposition with the respective corners of the workpiece 16 mounted in work holder 13. Mirror 12 is preferably adapted to be swung upward toward web 14 to provide ready access for installing workpiece 16 in work holder 13. By forward and backward adjustment and by lateral adjustment of the workpiece 16 in the adjustable work holder 13, the workpiece is brought into careful alignment with the first of these full-size partial images 17 in the series on web 14, and subsequent partial images in the series automatically fall into registration through the programming of web 14 to be described below.

The web 14 is preferably a translucent flexible sheet of mylar film between 3.5 mils and 4.5 mils thick. This is a substantially clear mylar, with a matte finish on one or both sides, and a matte finish side of film 14 is preferably exposed to view in mirror 12 eliminating specular reflections from the mylar film 14.

PROGRAMMING OF THE FULL-SIZE IMAGES ON THE WEB

The longitudinally elongated web 14 of mylar film is programmed by placing the successive full-size partial images 17 thereon using the programming unit 19 shown in FIGS. 4, 5 and 6. This comprises a light box having internal illumination sources such as lamp bulbs 21, under-lighting a translucent top surface such as a sheet of frosted glass 22. Surface 22 bears a center target mark 23 if desired, and index code indicia guide marks 24.

A full size drawing, photocopy or photograph 26 of the workpiece 16, which may be called the "artwork" showing all of the part-positioning spaces, perforations or the like, is placed on the upper surface of frosted glass 22 and held in place by masking tape, adhesive tape or other convenient means, aligned with the center target mark 23.

A roll of the mylar film web 14 on a feed reel 27 is loaded on the feed reel support means provided on the left-hand side of the programming unit 19. The free end of the mylar film 14 is led upward and over the top of the programming unit 19, overlying the artwork 26 and the frosted glass 22, and secured by masking tape on a take-up reel 28, rotatably mounted on rigid hand support means in programming unit 19. The feed reel 27 and the take-up reel 28 may each be provided with drive motors, or they may be rotated by hand cranks as desired.

If a mylar film with only one matte surface is employed, the smooth, glossy outer surface of the mylar film web 14 is exposed to view, overlying the programming unit 19 as appears in FIG. 4, and an index code indicium 29 which may be a small white rectangle of dry transfer or rub-on material for example, is applied to the film 14 in line with the index code guidelines 24 on frosted glass 22 viewed through the film 14 as shown in FIG. 4. If both surfaces of web 14 are matte-finished, ink, graphite "lead" pencil and grease pencil marks are well retained.

When the first frame showing a full-size partial image 17 of the workpiece 16 is being programmed, at least the four corners A1, B1, C1 and D1 should be shown by corner indicia on film 14. If desired, the outline of the image 17 may connect these corners to aid the operator in positioning the workpiece by adjusting work holder 13 to bring the workpiece into direct superposition with the full size image 17 when it is first viewed in the locator device 10 prior to the first treatment step to be performed on workpiece 16. Subsequent full-size partial images may omit the corner indicia A1, B1, C1, D1 since the target mark 23 will correspond to the same point on the successive workpiece images 17 in all subsequent full-size partial images. "Dry transfer" indicia such as those sold by Chartpak Graphic Products of Leeds, Massachusetts are easily applied to mylar film web 14, and can be scraped off and replaced if necessary to enter "editorial revisions".

The longitudinal "braking" distance between the image 17 and the index code indicium 29 employed to arrest the forward indexing movement of web 14 should be identical for each successive frame, and the braking time required to stop the feed mechanism in response to the arrival of index code indicium 29 in juxtaposition with an index code sensor 31 in locator 10 will govern the lateral position of the full-size partial image 17 on the film 14 above the mirror 12 in locator device 10 during actual use. Since the first frame partial image 17 will stop at this braking position during normal operation of the device, and since the workpiece will be positioned to coincide with the operator's view of this first partial image 17 in mirror 12 by longitudinal and lateral adjustment of the workpiece on work holder 13, subsequent full-size partial images 17 and subsequent frames along web 14 should normally come to rest in substantial coincidence with workpiece 16 as viewed through the operator through mirror 12.

Minor differences in the braking time of the web 14 as it travels through the device may be compensated by the operator through minor adjustments in the workpiece position on work holder 13 as required. The component part P1 shown in FIG. 4 in the upper left-hand portion of the full-size partial image 17 is positioned so that it will produce an image P2 when viewed by the operator through mirror 12 as shown in FIGS. 2 and 3. Successive full-size partial images appearing in subsequent frames along web 14 will show new component parts P3, P4, P5, P6 and so forth, not indicated in the drawings, at different positions within the image rectangle A1, B1, C1, D1, positioned to produce images of these new component parts at the exact locations where they are to be installed by the operator during each successive treatment step performed on workpiece 16.

After the last frame of full size partial images is programmed, the next ensuing empty frame should be provided with a rewind index code indicium such as a pair of rectangles 32 placed on the mylar film 14, shown in FIG. 4A. After rewinding is completed and the first frame is again in position, further rewinding by a distance of a single frame or less should permit the programmer to place a rewind stop code on the film 14, such as a group of three rectangles 33, shown in FIG. 4B, again placed between the index code guidelines 24 inscribed on the frosted glass 22, to assure juxtaposition with the index code sensor 31 in the locator device 10.

CONSTRUCTION AND OPERATION OF THE LOCATOR DEVICE

After programming, the mylar web 14 is removed from the programming device 19 and mounted in the locator device above mirror 12 as indicated in FIGS. 2 and 3. The feed roller 27 carrying the programmed web of mylar film 14 is positioned in the feed roller support in the upper left-hand portion of the locator device 10 at position 27A and the mylar film is preferably fed from this feed roller 27A in a clock-wise direction around a feed idler sprocket roller 34 provided at each end with sprocket teeth for registration with sprocket holes formed along both edges of mylar film web 14.

After threading around sprocket roller 34, the web 14 is drawn across the underside of a mounting plate 36 to the opposite side of the locator device 10, where it is passed between an index code sensor 31 and a sprocket tape-up drive roller 37. The shaft of roller 37 is mounted by a direct axial connection or by a gear drive connection to a stepping motor 38 shown in FIGS. 7 and 10, mounted on the rear portion of plate 36, and preferably on an up-turned rear flange 39 thereof. The stepping motor 38 is connected to suitable feed drive circuitry not shown in the drawings, and is be started by the operator through the actuation of a foot pedal 40 or other start switch, causing the web 14 to advance from feed idler sprocket roller 34 around sprocket take-up drive roller 37, and thence to a tension take-up roller 43.

For example, in a commercial embodiment of the locator device 10 known as the "CS1200 Component Locator", manufactured and offered for sale by Contact Systems, Inc., Miry Brook Road, Danbury, Connecticut, the stepping motor 38 is designed to move 1.8° per step, and the steps are governed by a series of pulses driving a counter and a shift register in the control circuitry to determine the exact longitudinal position of web 14. The web is thus indexed from frame to frame through the successive full-size partial images 17 in response to index commands received from the operator's foot switch 40 or other actuating switch.

Two small tension motors 41 and 42 are mounted on the forward side of rear flange 39, and are provided with timing gears connected by timing belts to corresponding timing gears mounted on the rear ends of the feed roller 27A and the tension take-up roller 43 respectively, with the free end of web 14 passing around sprocket take-up drive roller having been threaded onto tension take-up roller 43 and held in place by masking tape, for example.

The small motors 41 and 42 are maintained in a "stalled" condition to provide tension on both rollers 27A and 43, thus maintaining tension on web 14. As viewed in FIG. 8, motor 41 tends to cause feed roller 27A to revolve in a counter-clockwise direction, while motor 42 tends to cause tension take-up roller 43 to revolve in a clockwise direction, via the respective timing belts 44 and 46 shown in FIGS. 7, 8 and 10.

It should be noted that the underside of web 14 passing beneath plate 36 is preferably the slightly roughened or frosted matte surface side of the mylar film, which is the inner side of this film as it is rolled on feed roller 27. This matte surface comprises the underside of the film 14 passing across the programming unit 19 as well as the underside of the film 14 passing across the upper portion of the locator device 10, and this matte surface forming the under-side of web 14 is exposed to illumination provided by the rectangular glow discharge tube lamp 15 underlying the periphery of mirror 12, or by a back-lighting diffusion panel 47 in the front surface of the supporting pedestal 48 forming a base for the locator device 10. The light produced by tubular lamp 15 or by fluorescent tubes or lamp bulbs behind this back-lighting diffusion panel 47 fully illuminates the web 14 from below, and reflection from the web and from the mirror 12 both serve to illuminate the workpiece 16, but specular reflection from the web 14 is avoided by its matte surface. This eliminates glare or glossy reflections which might otherwise distract the operator from the visual guidance provided by the full-size partial images and the indicia thereon indicating the steps to be performed in each successive treatment operation on workpiece 16.

SYNCHRONIZED DELIVERY OF COMPONENT PARTS

As indicated in FIG. 1, one or more of the component storage and presentation assemblies 11 are normally positioned in close proximity to the locator device 10 during use. A plurality of multi-level rotary bins 49 are provided on assembly 11. Bins 49 are pie shaped, with pie-slice sectors separated by partitions to form separate bin storage zones for separate individual component parts to be used by the operator. These bins 49 are mounted on a vertically-movable vertical shaft 51, adapted for installation and removal of each bin utilizing an open sector portion 52 of its periphery.

As shown in FIG. 1, one of the bins 49 is being placed in position after loading parts therein. The entire assembly of bins can then be lowered by the downward movement of shaft 51 until only the uppermost bin 49 is exposed to view above the cylindrical housing 53 forming an open-topped enclosure beside the pedestal 48 of unit 10. All of the array of bins 49 except the uppermost bin are thus telescopically housed inside housing 53.

As the programmed web 14 is moved into first-frame position in unit 10, suitable indexing connections between the circuitry of unit 10 and the control circuitry of the assembly 11 cause the uppermost bin tray 49 to revolve to bring its first sector bin into position above the open sectors 52 of the other bins at a position closely exposed to the operator's work station. As the second frame is indexed into position in locator device 10 by actuation of foot pedal switch 40, the next bin around the periphery of the uppermost bin tray 49 is successively moved into position, and with each succeeding frame of web 14, a succeeding bin of tray 49 is indexed simultaneously into position for delivery of the component parts to be mounted on workpiece 16 in each successive treatment operation.

After the periphery of tray 49 has been fully utilized, shaft 51 moves one notch upward to expose the second bin tray, whose first sector bin is moved into position, and the second bin tray is then indexed to expose its sector bins successively as each succeeding frame of web 14 is exposed to the operator's view to mirror 12.

In this manner, the programming of web 14, showing the operator the shape and location of the component part to be installed during a particular treatment operation on workpiece 16 simultaneously and automatically exposes a bin tray containing these component parts for selection and use by the operator during the performance of this treatment operation, and each full-size partial image appearing in each successive frame of web 14 in turn coincides with a new bin tray sector delivering the required component part for the operator's use during each successive treatment operation.

When all frames of web 14 have been displayed to the operator and the corresponding series of operational steps performed on workpiece 16 has been completed, the next index command from pedal switch 40 brings rewind index code 32 into juxtaposition with sensor 31, initiating high speed rewinding of web 14 by motors 38, 41 and 42. When rewind stop code 33 passes sensor 31, the web 14 is stopped, and the series of operations may be performed on the next workpiece 16.

The electrical circuitry governing the operation of the tension motors 41 and 42, the index stepping motor 38 and the switching and simultaneous indexing of the bin tray assembly 11 is believed to be substantially conventional in design and operation, being generally comparable to the feed drive mechanism utilized with any incrementally indexed web, or the mechanism incorporating high-speed forward and high-speed rewind modes comparable to those utilized in conventional tape recorder drive mechanisms.

In the CS1200 Component Locator device manufactured and sold by Contact Systems, Inc., a rewind speed of 60 feet per minute is utilized, and the mylar film web is 16.50 inches wide, the sprocket holes ½ inch apart, the usable work area surrounding workpiece 16 is 15 inches by 20 inches, and the total weight of the locator device 10 is only about 200 pounds.

The use of an easily programmed mylar film showing full size partial images in succession corresponding to each successive operation to be performed on the workpiece 16 vastly simplifies the registration and alignment of the visual guidance image with the workpiece itself. The operator is not required to look back and forth from the workpiece to an instruction panel. Instead, the operator looks directly at the workpiece 16 and sees automatically superimposed thereon in a substantially exact registration therewith an image of the component part. Thus the part P1 shown in FIGS. 2 and 3 appears as an image P2 on the workpiece 16 in the exact size, shape and location where this component part is to be installed.

At the same time, the appropriate sector bin 49 of the assembly 11 is presented to the operator containing the component part to be installed during this treatment operation. The operator need only reach for a part and place it in the precise location indicated in order to complete each treatment operation. The convenient foot pedal 40 then indexes the visual guidance image and the part delivery assembly 11 automatically, and the operator may proceed with successive treatment operations at the most comfortable and efficient pace, selected only in the operator's discretion by operation of the foot pedal index switch 40.

Initial registration and alignment of the workpiece 16 to coincide with the image of the first frame of the web 14 generally serves to assure superimposed coincidence of the visual guidance image with the workpiece throughout the series of treatment operations, and subsequent minor adjustments are easily made by manipulating the work holder 13.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which as a matter of language, might be said to fall therebetween.

Having described my invention, what I claim as new and desire to secure by Letters Patent is:

1. A method for providing visual guidance to an operator performing successive operational treatment steps on a workpiece, comprising the steps of:
  A. positioning a partially reflective and partially transmissive mirror in a workzone beneath a code indicia sensor;
  B. adjustably positioning a workpiece in the workzone beneath the mirror for convenient observation therethrough during treatment of the workpiece;
  C. marking an elongated web with a plurality of successive full-size partial images of the workpiece thereon each carrying operational instruction indicia;
  D. marking the elongated web with successive index code indicia positioned relative to the partial workpiece images in accurate registration for justaposition with the code indicia sensor;
  E. movably positioning the web for longitudinal indexed incremental advance above the mirror past the sensor in a position where the successive partial images reflected in the mirror appear to the operator to be superimposed on the workpiece viewed therethrough; and
  F. advancing the web longitudinally in successive index increments each terminated by a signal produced by the sensor in response to the juxtaposed arrival of one of the index code indicia.

2. The method defined in claim 1 wherein the marked web is movably positioned for longitudinal movement in an upper plane converging with the plane of the mirror at an angle X, and the workpiece is positioned in a lower plane also converging with the plane of the mirror at an angle X, with all three planes intersecting along substantially the same intersection line.

3. The method defined in claim 1 wherein the workpiece is adjusted in the workzone to bring the first partial image observed by the operator into substantially exact superposition with the workpiece.

4. The method defined in claim 1, further including the steps of presenting in turn a series of parts storage bins exposed to the operator, and indexing these bins synchronously with the successive index increments of the webs longitudinal advance.

5. The method defined in claim 1 wherein the web is formed of flexible translucent plastic film, and both the partial images and the index code indicia are marked on a first upper surface of the web, while its opposite lower surface is then exposed to the operator's view in the mirror.

6. The method defined in claim 5 wherein the opposite lower surface of the web is provided with a matte finish, blocking specular reflection therefrom.

7. Apparatus for providing visual guidance to an operator performing successive operational treatment steps on a workpiece, comprising:
A. a supporting base;
B. a partially reflective and partially transmissive mirror mounted on the base protruding into a workzone beneath a code indicia sensor;
C. a workpiece holder mounted on the base and extending into the workzone beneath the mirror for convenient observation therethrough by the operator during treatment of the workpiece;
D. an elongated web marked with a plurality of successive full-size partial images of the workpiece thereon each carrying operational instruction-indicia;
E. means on the elongated web forming successive index code indicia positioned relative to the partial workpiece images in accurate registration for juxtaposition with the code indicia sensor;
F. means on the base movably positioning the web above the workzone for longitudinal indexed incremental advance above the mirror past the sensor in a position where the successive partial images reflected in the mirror appear to the observer to the operator to be superimposed on the workpiece viewed therethrough; and
G. drive means for advancing the web longitudinally in successive index increments each terminated by a signal produced by the sensor in response to the juxtaposed arrival of the index code indicia.

8. The apparatus defined in claim 7 wherein the mirror is adjustably mounted on the base.

9. The apparatus defined in claim 7 wherein the mirror is resiliently toggle-mounted to be moved between two stabilized positions, an extended operative position and a retracted position exposing the workpiece to the direct view of the operator.

10. The apparatus defined in claim 7 wherein the elongated web is formed of flexible translucent plastic sheet material.

11. The apparatus defined in claim 10 wherein the plastic web sheet material is provided with a non-glossy matte finish on the side exposed to the mirror.

12. The apparatus defined in claim 7, further including an illuminating lamp mounted in the base below the mirror and above the workpiece and delivering diffused light to the exposed surface of the marked web while also illuminating the workpiece to expose perforations therein.

13. The apparatus defined in claim 7 wherein the workpiece holder is adapted for adjustable positioning of the workpiece in lateral, forward and rearward directions and in a direction toward and away from the mirror for accurate superposition of each partial image in apparent coincidence with the workpiece.

14. The apparatus defined in claim 7 wherein the movable web positioning means supports the web for longitudinal movement in an upper plane converging with the plane of the mirror at an angle X, and the workpiece holder positions the workpiece in a lower plane also converging with the plane of the mirror at an angle X, with all three planes intersecting along substantially the same intersection line.

* * * * *